(12) United States Patent
Wenk et al.

(10) Patent No.: US 12,539,756 B2
(45) Date of Patent: Feb. 3, 2026

(54) CONTROL UNIT FOR A VEHICLE WITH AT LEAST ONE ELECTRIC MOTOR AND A TRANSMISSION

(71) Applicant: Vitesco Technologies Germany GmbH, Hannover (DE)

(72) Inventors: Alexander Wenk, Burgoberbach (DE); Peter Schroll, Nuremberg (DE); Karl Maron, Heroldsberg (DE); Simon Kim, Nuremberg (DE); Yvonne Wiegand, Mainstockheim (DE)

(73) Assignee: Vitesco Technologies German GmbH, Regensburg (DE)

( * ) Notice: Subject to any disclaimer, the term of this patent is extended or adjusted under 35 U.S.C. 154(b) by 494 days.

(21) Appl. No.: 18/297,614

(22) Filed: Apr. 8, 2023

(65) Prior Publication Data

US 2023/0241970 A1    Aug. 3, 2023

Related U.S. Application Data

(63) Continuation of application No. PCT/EP2021/077731, filed on Oct. 7, 2021.

(30) Foreign Application Priority Data

Oct. 9, 2020    (DE) .................... 10 2020 212 803.0

(51) Int. Cl.
*B60K 26/00* (2006.01)
*H05K 5/00* (2006.01)
*H05K 7/20* (2006.01)

(52) U.S. Cl.
CPC .......... *B60K 26/00* (2013.01); *H05K 5/0082* (2013.01); *H05K 7/20409* (2013.01);
(Continued)

(58) Field of Classification Search
None
See application file for complete search history.

(56) References Cited

U.S. PATENT DOCUMENTS 5,057,903 A * 10/1991 Olla .................... H01L 23/4334
257/E23.044
7,272,015 B2 * 9/2007 Karrer ................. B60R 16/0239
174/15.1
(Continued)

FOREIGN PATENT DOCUMENTS

DE         3918767 A1    12/1989
DE     102010030891 A1     1/2012
(Continued)

OTHER PUBLICATIONS

International Search Report and Written Opinion dated Jan. 17, 2022 from corresponding International Patent Application No. PCT/EP2021/077731.
(Continued)

*Primary Examiner* — Krystal Robinson

(57) ABSTRACT

A control unit for a vehicle with at least one electric motor and a transmission includes a housing and a heat sink. The housing supports transmission control electronics and converter electronics for controlling an electric motor. The heat sink is arranged between a housing upper part and a housing lower part such that the heat sink forms a part of the housing. The housing upper part is arranged on a raised peripheral rim of the heat sink in a thermally conductive way such that the housing upper part and the heat sink form a media-tight cavity. The converter electronics are connected directly to the heat sink, and the transmission control electronics are connected to the inner side of the housing upper part such that the transport of heat takes place from the transmission control electronics, via the housing upper part, to the rim of the heat sink.

10 Claims, 4 Drawing Sheets

(52) U.S. Cl.
CPC ...... *H05K 7/20854* (2013.01); *B60Y 2306/05* (2013.01); *H05K 2201/066* (2013.01)

(56) References Cited

U.S. PATENT DOCUMENTS

| | | | | |
|---|---|---|---|---|
| 7,751,193 | B2* | 7/2010 | Tominaga | .......... H05K 7/20854 |
| | | | | 174/16.3 |
| 2009/0206662 | A1 | 8/2009 | Kakuda | |
| 2012/0177074 | A1* | 7/2012 | Liu | ............... H01S 5/0235 |
| | | | | 165/185 |
| 2013/0105205 | A1* | 5/2013 | Takagi | ............... H05K 1/09 |
| | | | | 174/257 |
| 2013/0215582 | A1 | 8/2013 | Robin | |
| 2014/0132379 | A1 | 5/2014 | Vafakhah | |
| 2014/0132382 | A1 | 5/2014 | Zarei | |
| 2015/0359107 | A1* | 12/2015 | Steinau | ............ H01L 23/49531 |
| | | | | 29/841 |
| 2018/0102304 | A1 | 4/2018 | Robin | |
| 2019/0311968 | A1 | 10/2019 | Maier | |
| 2021/0227681 | A1* | 7/2021 | Steinau | ............... H01L 23/367 |
| 2023/0389197 | A1* | 11/2023 | Wenk | .................. H05K 5/0082 |

FOREIGN PATENT DOCUMENTS

| | | |
|---|---|---|
| DE | 102013222587 A1 | 5/2014 |
| DE | 102013222595 A1 | 5/2014 |
| DE | 102013222599 A1 | 5/2014 |
| DE | 112008002870 B4 | 5/2015 |
| DE | 102014201032 A1 | 7/2015 |
| DE | 102015207310 A1 | 10/2016 |
| DE | 202016103798 U1 | 10/2017 |
| DE | 102018205243 A1 | 10/2019 |
| WO | 2020074214 A1 | 4/2020 |

OTHER PUBLICATIONS

German Office Action dated May 6, 2022 for corresponding German Patent Application No. 10 2020 212 803.0.

* cited by examiner

CONTROL UNIT FOR A VEHICLE WITH AT LEAST ONE ELECTRIC MOTOR AND A TRANSMISSION

CROSS-REFERENCE TO RELATED APPLICATIONS

This application claims the benefit of International Application PCT/EP2021/077731, filed Oct. 7, 2021, which claims priority to German Application 10 2020 212 803.0, filed Oct. 9, 2020. The disclosures of the above applications are incorporated herein by reference.

TECHNICAL FIELD

The disclosure relates to a control unit for a vehicle with at least one electric motor and a transmission.

BACKGROUND

Electromobility means, in particular, the use of electric cars. These are driven fully or partially electrically, have an onboard energy store, and receive their energy predominantly from the power network.

Hybrid vehicles combine two drive technologies. Shorter distances can generally be covered electrically but they can also manage long distances using their internal combustion engine. Hybrid cars which can also be charged at an electric outlet are referred to as plug-in hybrids. Hybrid vehicles are considered a bridging technology until cars are driven completely by electricity.

The vehicles are generally provided with a transmission which is designed to transmit torque between an input and an output of the transmission by way of torque transmission clutches.

Operation of the transmission is controlled by a transmission control unit.

A further central component of the electric drive train in hybrid and electric vehicles are the power electronics. They are responsible, in particular, for activating the electric machine, communicating with the vehicle control system, and diagnosing the drive.

The power electronics generally includes an electronic control unit, an inverter, and a DC-to-DC converter. The control unit represents the switching center of the power electronics.

DC-to-AC converters or inverters convert the direct current of the battery into alternating current for the drive of the electric motor. The electric motor finally converts electrical energy into mechanical energy. This process is reversed in order to charge the battery.

The AC-to-AC converter is part of the further central components of an electric-powered vehicle. It converts the high battery voltage, of 100-400 volts or more, into the much lower operating voltage, of 12 or 48 volts, for electronic sub-assemblies.

DE 10 2013 222 599 A1 describes a vehicle with an internal combustion engine and an electric motor, where a transmission control module also controls the electric motor, the inverter, and the DC-to-DC converter in addition to the transmission.

SUMMARY

The disclosure provides a compact control unit for a vehicle with at least one electric motor and a transmission, as a result of which the number of the individual parts of the control unit can be minimized and where it is possible for expensive, relatively low-loss structural elements to be dispensed with by virtue of the efficient removal of the heat generated by the electronics.

One aspect of the disclosure provides a control unit for a vehicle with at least one electric motor and a transmission.

In the control unit, a housing includes a housing upper part and a housing lower part. A heat sink is arranged between the housing upper part and the housing lower part in such a way that the heat sink forms a part of the housing.

The heat sink has a raised peripheral rim, where the housing upper part is arranged in a thermally conductive way on the rim which is configured as plane. Additionally, the housing upper part and the heat sink form a media-tight cavity for accommodating the converter electronics and the transmission control electronics. The converter electronics are connected directly to the heat sink in a thermally conductive way.

The transmission control electronics are in turn connected to the inner side of the housing upper part in a thermally conductive way such that the transport of heat takes place from the transmission control electronics, via the housing upper part, to the rim of the heat sink. The transport of heat from the transmission control electronics to the heat sink accordingly takes place indirectly.

A compact control unit for an inverter and a transmission with a common efficient cooling device is consequently provided which can be used in a vehicle both as an attached-to and standalone control unit.

In some implementations, the thermally conductive connection between the converter electronics and the heat sink, and the thermally conductive connection between the transmission control electronics and the housing upper part is provided or reinforced by way of a heat-conductive material.

Depending on the quantity of heat to be dissipated and depending on the size of the contact area of the parts involved in the heat transmission, standard silicon-based heat-conductive pastes or high-performance heat-conductive pastes or heat-conductive adhesives with improved thermal conductivity can, for example, be used.

Because the transport of heat takes place from the transmission control electronics to the rim of the heat sink indirectly via the housing upper part, it is appropriate in this case to use a high-performance heat-conductive paste for the connection. Both a thermally conductive effect and an adhesive effect are obtained when a heat-conductive adhesive is used as a heat-conductive material.

In some examples, the transmission control electronics and the housing upper part are mechanically connected to each other by at least one connecting means which acts, for example, in a frictionally engaged way. The connecting means can be a pin-like connecting means, for example a rivet or a screw. The additional use of a heat-conductive paste between the transmission control electronics and the housing upper part increases the transport of heat away from the transmission control electronics.

In some examples, the housing upper part and the heat sink are mechanically connected to each other by way of at least one connecting means which acts, for example, in a frictionally engaged way. Here too, the connecting means can be a pin-like connecting means, for example a rivet or a screw. The larger the contact surface between the housing upper part and the heat sink, in particular the rim of the heat sink, the better the heat conductance between these parts. A sealing means can additionally be arranged between the housing upper part and the rim of the heat sink. A solid seal or alternatively a liquid seal are conceivable as the sealing means. Depending on the nature of the sealing means, the thermal conductivity between the housing upper part and the heat sink can also additionally be improved.

In some implementations, a shield is arranged in the housing upper part, between the transmission control electronics and the converter electronics. This shield serves to reduce or avoid reciprocal damaging electromagnetic interference (EMI) between the converter electronics and the transmission control electronics. In addition to reducing the EMI between the converter electronics and the transmission control electronics, the shield serves also to reduce or avoid thermal interaction, such as reciprocal heating, between the converter electronics and the transmission control electronics. The heat radiated by the electronics is thus conducted to the housing upper part via the shield, and from the housing upper part to the rim of the heat sink. For example, a flat shield, such as a piece of sheet steel or a piece of a different sheet metal, can here be arranged at two opposite edge lengths of the shield, contacting the housing upper part. The mechanical connection of the shield to the housing upper part can be configured in a frictionally engaged or form-fitting way.

The shield could also consist of a composite structure made from plastic and a special EMI protective foil. Alternatively, the shield could also be arranged on the heat sink.

In some implementations, the housing upper part can be configured as a deep-drawn sheet-metal part. This is simple to produce, cost-effective, and takes up a small amount of structural space.

In some examples, for transporting heat in the case of relatively high power requirements the housing upper part can be configured as an aluminum high-pressure die-cast part with an enlarged surface, such as in the form of cooling fins, for additional radiation of heat to the surroundings.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
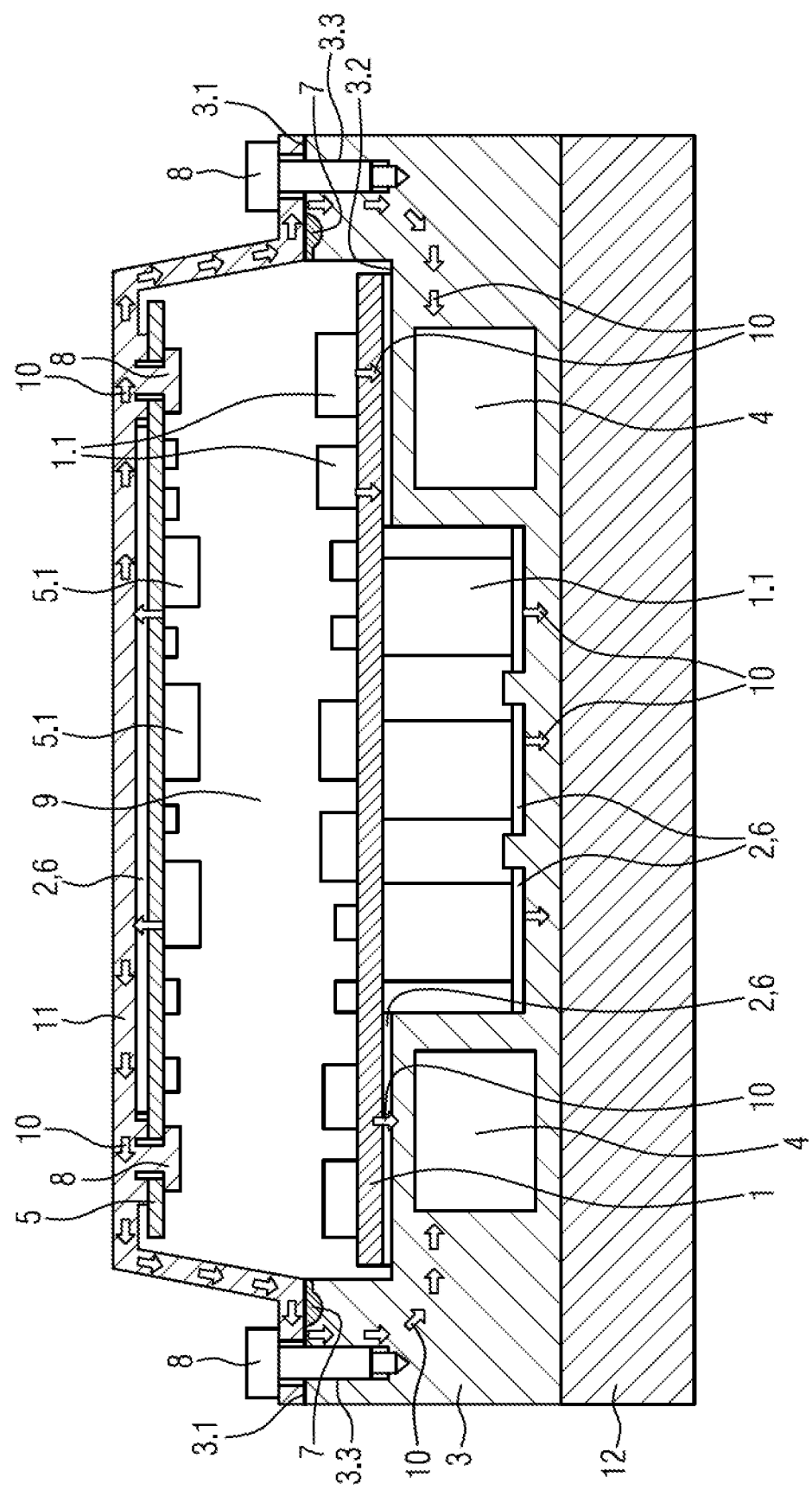
FIG. 1 shows a schematic view in section through an exemplary control unit.

FIG. 1 shows a control unit for a vehicle which has at least one electric motor and a transmission, for example an electric car or a hybrid vehicle. The control module has a housing 11, 12 for accommodating transmission control electronics 5 for controlling the transmission, and for accommodating converter electronics 1 for controlling an electric motor. The control unit additionally has a heat sink 3 to remove, via a coolant, the heat generated by the electronics.

The housing 11, 12 includes a housing upper part 11 and a housing lower part 12. The housing upper part 11 is configured in its simplest design as a deep-drawn sheet-metal part.

The heat sink 3 is arranged between the housing upper part 11 and the housing lower part 12 such that the heat sink 3 forms a part of the housing 3, 11, 12.

The heat sink 3 has a raised peripheral rim 3.1 of a plane design, where the housing upper part 11 bears against the rim 3.1 with good thermal conductance.

The housing upper part 11 and the heat sink 3 are mechanically connected by at least one, in this case two, connecting means 8, where the connecting means 8 is accommodated, through a corresponding bore in the housing upper part 11, in a corresponding socket 3.3 of the heat sink 3. In FIG. 1, a screw 8 is here screwed into a corresponding thread 3.3 in the heat sink 3.

The housing upper part 11 and the heat sink 3 form a media-tight cavity 9 for accommodating the converter electronics 1 and the transmission control electronics 5. The converter electronics 1 includes a printed circuit board and electronic structural elements 1.1. The electronic structural elements 1.1 are attached on both the upper side, facing the housing upper part 11, of the printed circuit board of the converter electronics 1 and on its underside, where the electronic structural elements 1.1 are here arranged on the underside in the central area of the printed circuit board, such as in the vicinity of a coolant duct 4. Because both sides of the printed circuit board of the converter electronics 1 are populated, the heat sink 3 has, at the periphery in the direction of its rim 3.1, a step 3.2 on which bears that part of the underside of the converter electronics 1 that has no structural elements. A heat-conductive material 2 between the step 3.2 of the heat sink 3 and the converter electronics 1 ensures good transport of heat 10 from the converter electronics 1 to the heat sink 3. When a heat-conductive adhesive 2 is used, an extra mechanical connection between the converter electronics 1 and the heat sink 3 can be omitted.

In FIG. 1, the height of the step 3.2 is adapted to the height of the electronic structural elements 1.1 arranged on the underside of the converter electronics 1 such that the structural elements 1.1 are here directly connected in a thermally conductive way to the heat sink 3 by way of the heat-conductive material 2, 6.

In the case of these electronic structural elements 1.1 arranged on the underside of the converter electronics 1, the transport of heat 10 to the heat sink 3 thus takes place both via the printed circuit board of the converter electronics 1 and directly from the structural elements 1.1. For example, the printed circuit board can therefore be populated here with electronic structural elements 1.1 which generate a large amount of heat. Additionally, a high-performance heat-conductive material 6 can be used instead of a standard heat-conductive material 2 to further increase the transport of heat 10 to the heat sink 3.

The transmission control electronics 5, which include a printed circuit board with electronic structural elements 5.1, is here connected in a thermally conductive way to the inner side of the housing upper part 11 by way of a heat-conductive material 2, 6 such that transport of heat 10 takes place from the transmission control electronics 5 to the rim 3.1 of the heat sink 3 via the housing upper part 11. The transport of heat 10 from the transmission control electronics 5 to the heat sink 3 accordingly takes place indirectly.

The transmission control electronics 5 are mechanically connected in FIG. 1 to the housing upper part 11 on the inner side by way of at least one connecting means or connector 8, in this case are screwed by way of two screws. It may be possible to dispense with the connector 8 when a heat-conductive adhesive 2, 6 is used.

The transport of heat 10 from the transmission control electronics 5 to the housing upper part 11 can be increased further, for example, by the use of a high-performance heat-conductive material 6.

In principle, it is the case that the larger the contact surface between the housing upper part 11 and the heat sink 3, for example the rim 3.1 of the heat sink 3, the better the heat conductance between these parts. In order to increase the leaktightness of the housing, a sealing means or a sealant 7 can additionally be applied between the housing upper part 11 and the rim 3.1 of the heat sink 3. A solid seal as an inlaid seal or alternatively a liquid seal are possible as the sealing means or sealant 7. Depending on the nature and the use of the sealing means or sealant 7, the thermal conductivity between the housing upper part 11 and the heat sink 3 can also additionally be improved by its use, or in any case it should not be impaired.

The housing lower part 12 is fastened to the side of the heat sink 3 opposite the housing upper part 11 in a frictionally engaged way, for example by way of a screw, or in a materially bonded way by welding or gluing and in particular forms the interface of the control module, here in the form of an attached-to design, to a transmission (not shown). The control module, however, could also be installed in the vehicle as a standalone design, separated from the transmission.

Figure 2:
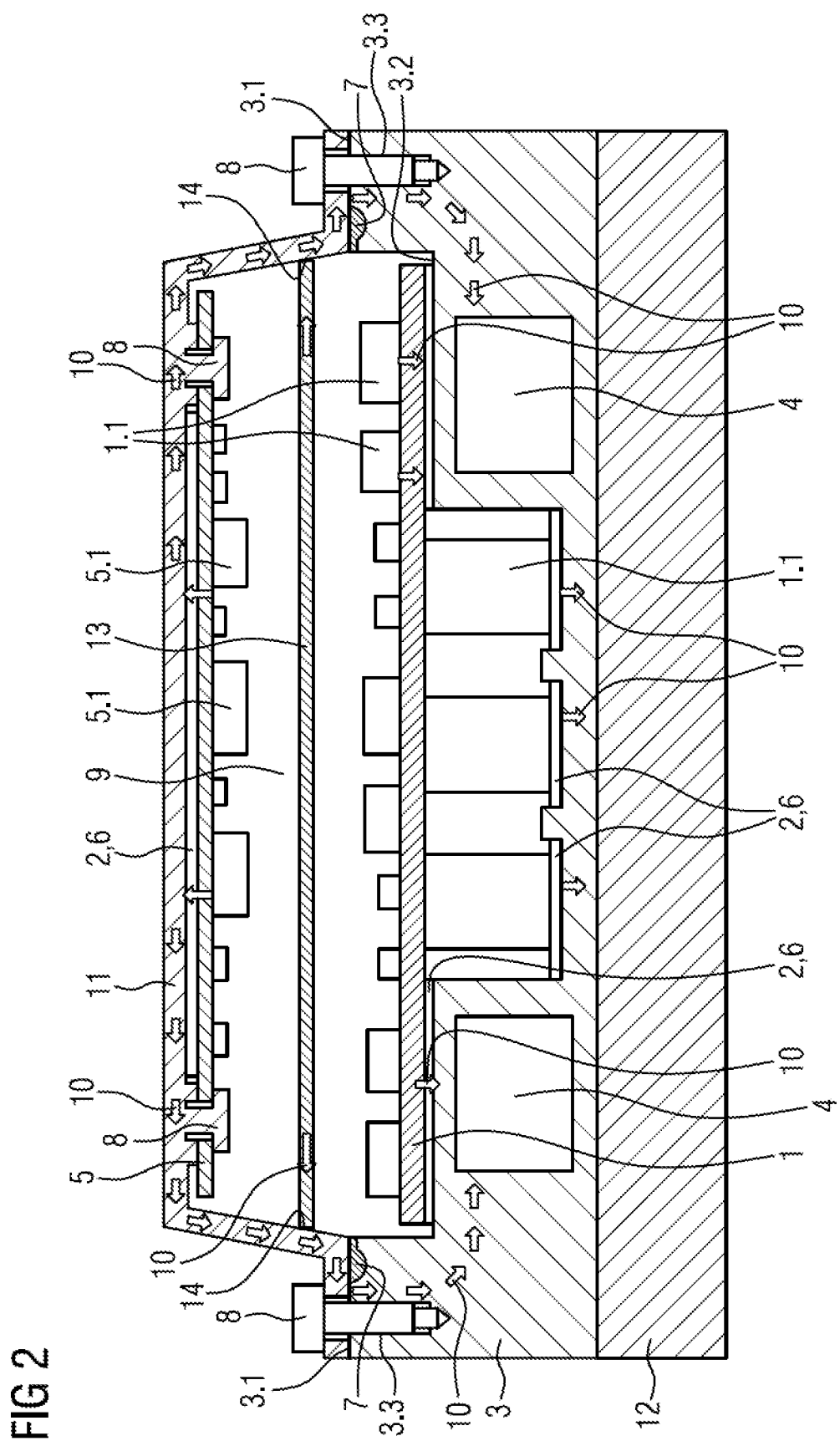
FIG. 2 shows a schematic view in section through a further exemplary control unit.

FIG. 2 shows a schematic view in section of a control unit as in FIG. 1 but a shield 13 is arranged in the housing upper part 11 between the transmission control electronics 5 and the converter electronics 1. Alternatively, the shield 13 could also be arranged on the heat sink 3. This shield 13 serves firstly to reduce or avoid reciprocal damaging electromagnetic interference (EMI) between the converter electronics 1 and the transmission control electronics 5. In addition to reducing the EMI between the converter electronics 1 and the transmission control electronics 5, the shield 13 serves also to reduce or avoid thermal interaction, such as reciprocal heating, between the converter electronics 1 and the transmission control electronics 5.

The heat from the converter electronics 1 and from the transmission control electronics 5 is thus conducted to the housing upper part 11 via the shield 13, and from the housing upper part 11 to the rim 3.1 of the heat sink 3. For example, a flat shield 13, such as a piece of sheet steel or a piece of a different sheet metal, can, for example, here be arranged at least at two opposite edge lengths 14 as contact points of the shield 13, contacting the housing upper part 11. The shield 13 could also include a composite structure made from plastic and a special EMI protective foil. In order to obtain optimum transport of heat 10, the shield 13 is fitted completely into the housing upper part 11 over all the edge lengths. The mechanical connection of the shield 13 to the housing upper part 11 can, for example, be configured such as in a frictionally engaged or form-fitting way.

This description of the arrangement and the function of the shield 13 also relates of course to the alternative where the shield 13 is arranged on the heat sink 3 instead of on the housing upper part 11.

Figure 3:
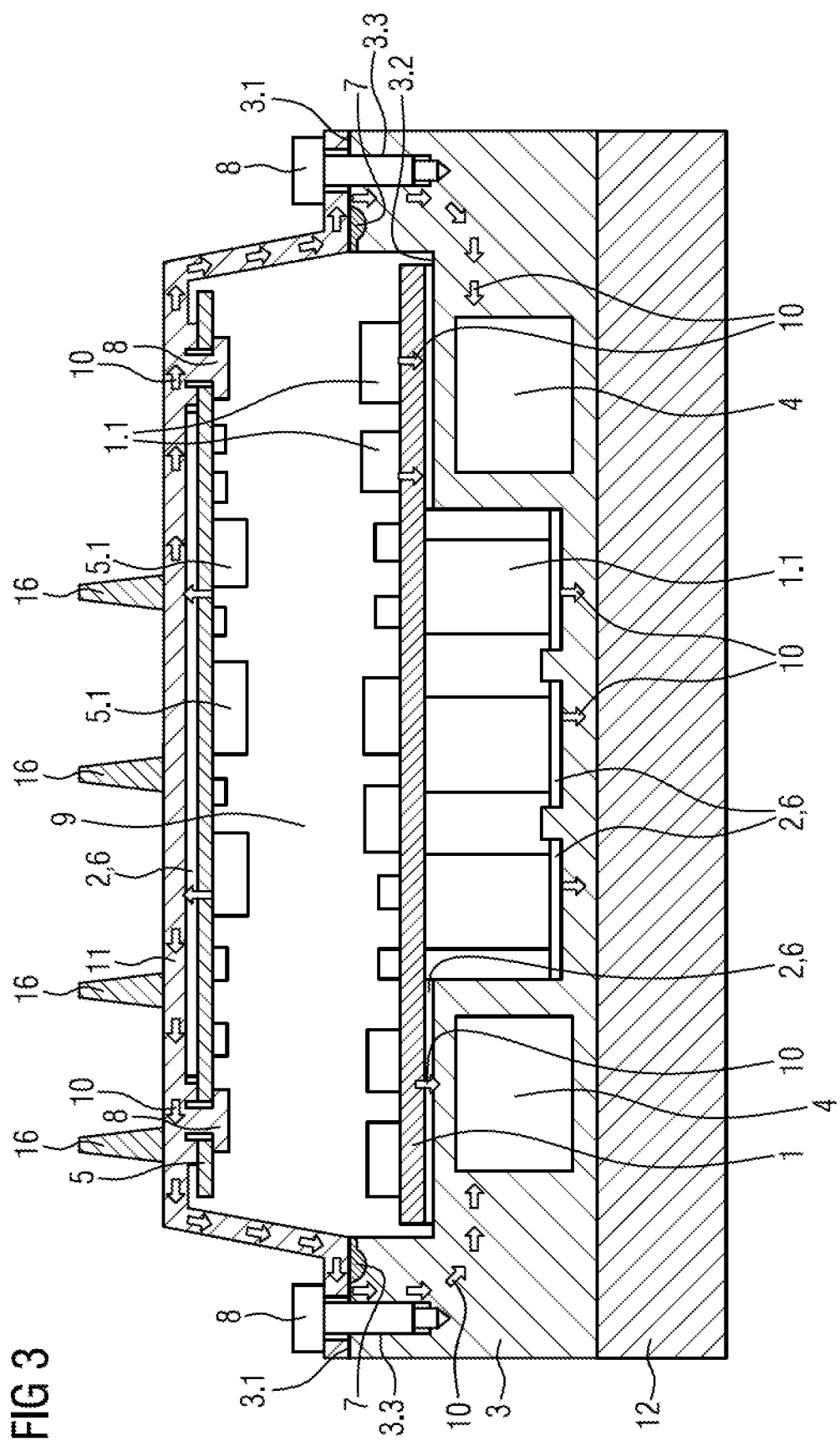
FIG. 3 shows a schematic view in section through an alternative exemplary control unit.

FIG. 3 shows a further schematic view in section of a control unit as in FIG. 1 but here, rather than a simple deep-drawn sheet-metal part, an aluminum high-pressure die-cast part with an enlarged surface in the form of cooling fins 16 is used here as the housing upper part 11. Additional radiation of heat to the surroundings takes place by the cooling fins 16.

Figure 4:
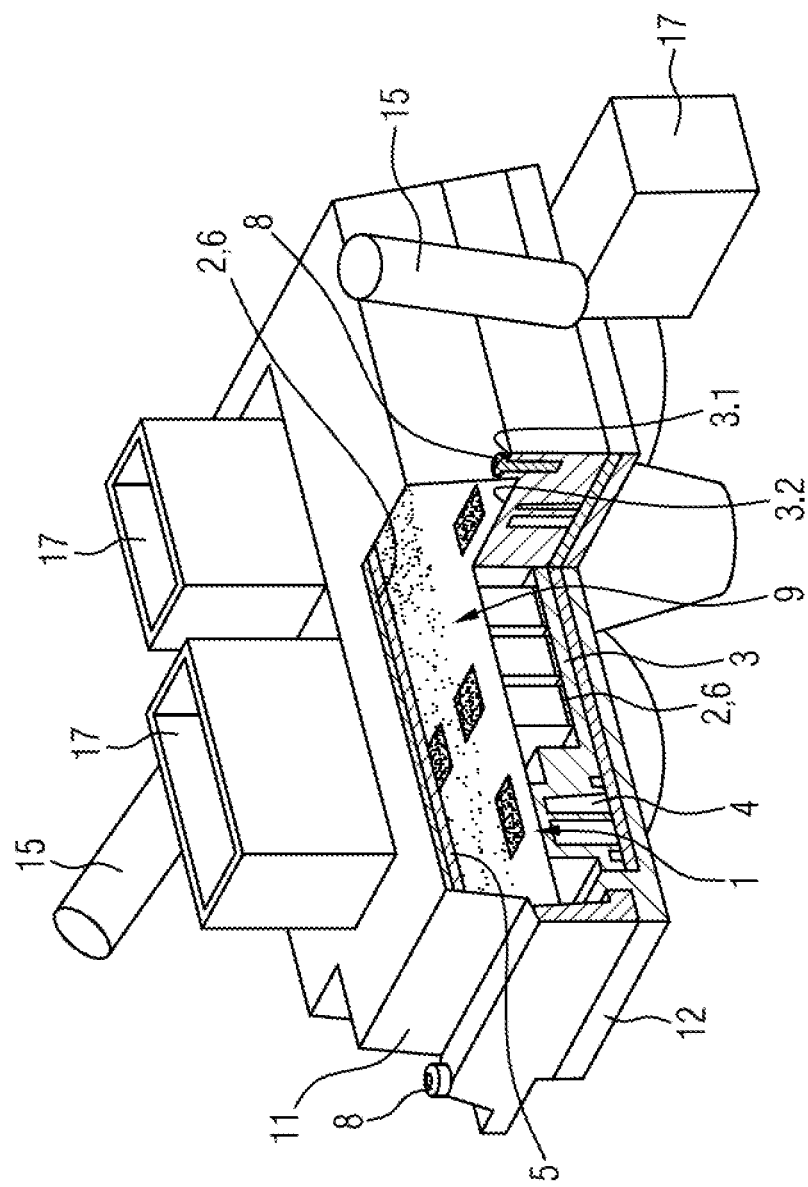
FIG. 4 shows a perspective view of an exemplary control unit.

FIG. 4 shows a perspective view of a control unit. The connections 17, for exchanging signals and supply voltages with the surroundings electronics (not shown), for the converter electronics 1 and the transmission control electronics 5 are arranged on the upper side of the housing upper part 11, but could also be located laterally on the housing upper part 11, or on the upper side of the housing lower part 12 or laterally on the housing lower part 12. A combination of both arrangements would also be conceivable.

Two cooling connections 15 of the heat sink 3 are shown in FIG. 4.

This compact control unit for an inverter and a transmission with a common efficient cooling device can be used in a vehicle both as an attached-to and standalone control unit.

A number of implementations have been described. Nevertheless, it will be understood that various modifications may be made without departing from the spirit and scope of the disclosure. Accordingly, other implementations are within the scope of the following claims.

What is claimed is:

1. A control unit for a vehicle with at least one electric motor and a transmission, the control unit comprising:
   a housing configured to accommodate transmission control electronics and converter electronics for controlling an electric motor, the housing comprises:
      a housing upper part, and
      a housing lower part; and
   a heat sink, the heat sink arranged between the housing upper part and the housing lower part in such a way that the heat sink forms a part of the housing, the heat sink including a raised peripheral rim, wherein the housing upper part is arranged on the rim in a thermally conductive way such that the housing upper part and the heat sink form a media-tight cavity for accommodating the converter electronics and the transmission control electronics,
   wherein the converter electronics are connected directly to the heat sink in a thermally conductive way, and
   wherein the transmission control electronics are connected to an inner side of the housing upper part in a thermally conductive way such that a transport of heat takes place from the transmission control electronics, via the housing upper part, to the rim of the heat sink.

2. The control unit of claim 1, further comprising a heat-conductive material providing a thermally conductive connection between the converter electronics and the heat sink and a thermally conductive connection between the transmission control electronics and the housing upper part.

3. The control unit of claim 2, wherein the heat-conductive material is a heat-conductive paste or a heat-conductive adhesive.

4. The control unit of claim 1, further comprising at least one connector mechanically connecting the transmission control electronics and the housing upper part.

5. The control unit of claim 1, further comprising at least one connector connecting the housing upper part and the heat sink to each other in a thermally conductive way and mechanically.

6. The control unit of claim 5, wherein the at least one connector is a screw or a rivet.

7. The control unit of claim 1, further comprising a flat shield arranged in the housing upper part between the transmission control electronics and the converter electronics.

8. The control unit of claim 1, further comprising a sealant is arranged between the rim of the heat sink and the housing upper part.

9. The control unit of claim 1, wherein the housing upper part is a deep-drawn sheet-metal part.

10. The control unit of claim 1, wherein the housing upper part is an aluminum high-pressure die-cast part with cooling fins.

\* \* \* \* \*